United States Patent [19]

Farnworth et al.

[11] Patent Number: 5,214,657
[45] Date of Patent: May 25, 1993

[54] METHOD FOR FABRICATING WAFER-SCALE INTEGRATION WAFERS AND METHOD FOR UTILIZING DEFECTIVE WAFER-SCALE INTEGRATION WAFERS

[75] Inventors: Warren M. Farnworth; Kevin Duesman; Ed Heitzeberg, all of Boise, Id.

[73] Assignee: Micron Technology, Inc., Boise, Id.

[21] Appl. No.: 908,495

[22] Filed: Jun. 30, 1992

Related U.S. Application Data

[63] Continuation of Ser. No. 586,267, Sep. 21, 1990, abandoned.

[51] Int. Cl.$^5$ .............................................. G06F 11/10
[52] U.S. Cl. .................... 371/40.1; 371/15.1; 365/200; 437/51; 437/52; 257/202
[58] Field of Search ............... 371/40.1, 51.1, 21.1, 371/15.1; 365/51, 200, 201; 357/45; 437/51, 52; 324/158 R

[56] References Cited

U.S. PATENT DOCUMENTS

| | | | |
|---|---|---|---|
| 3,539,876 | 5/1967 | Feinberg et al. | 317/101 |
| 3,774,088 | 11/1973 | Magdo et al. | 317/235 R |
| 3,781,683 | 12/1973 | Freed | 324/158 R |
| 3,835,530 | 9/1974 | Kilby | 29/574 |
| 3,839,781 | 10/1974 | Russell | 29/574 |
| 3,849,872 | 11/1974 | Hubacher | 29/574 |
| 4,439,727 | 3/1984 | Boyle | 324/158 R |
| 4,467,400 | 8/1984 | Stopper | 361/403 |
| 4,542,340 | 9/1985 | Chakravarti et al. | 324/158 R |
| 4,560,583 | 12/1985 | Moksvold | 427/88 |
| 4,595,944 | 6/1986 | Antipov | 357/51 |
| 4,630,355 | 12/1986 | Johnson | 29/575 |
| 4,703,436 | 10/1987 | Varshney | 364/490 |
| 4,750,027 | 6/1988 | Asami | 357/45 |
| 4,791,609 | 12/1988 | Ito | 365/51 |
| 4,866,508 | 9/1989 | Eichelberger et al. | 357/45 |
| 4,906,987 | 3/1990 | Venaleck et al. | 357/45 |
| 5,017,512 | 5/1991 | Takagi | 437/227 |
| 5,047,711 | 9/1991 | Smith et al. | 324/158 |
| 5,051,917 | 9/1991 | Gould et al. | 364/489 |
| 5,059,899 | 10/1991 | Farnworth et al. | 324/158 R |
| 5,091,883 | 2/1992 | Matsuzaki et al. | 365/51 |

FOREIGN PATENT DOCUMENTS 57-113241A 7/1982 Japan .
59-52860 3/1984 Japan .
61-263116 11/1986 Japan .

*Primary Examiner*—Charles E. Atkinson
*Attorney, Agent, or Firm*—Wells, St. John, Roberts, Gregory & Matkin

[57] ABSTRACT

The invention relates primarily to wafer-scale integration. Yet in one aspect, circuitry is provided to enable dicing of the wafer to use discrete memory sections thereon as memory chips should the wafer as a whole fail test. In another aspect, error detection and correction circuitry is provided within the street area to detect and correct errors generated within the discrete memory sections where wafer-scale integration manufacturing is successful. In another aspect, clusters of discrete sections of integrated circuitry are provided which include RAM integrated circuitry. One discrete section within the cluster comprises a) control circuitry to control and coordinate operation of discrete sections within the cluster, and b) error detection and correction circuitry to detect and correct errors generated within the discrete sections of RAM integrated circuitry. In still another aspect, test circuitry including fuses are provided within the street area and interconnect with selective portions of different discrete sections of circuitry. Fuses within the test circuitry would be provided and selectively blown to isolate the inoperative areas from each respective memory section, thereby effectively increasing the yield of operable circuitry on the wafer.

40 Claims, 5 Drawing Sheets

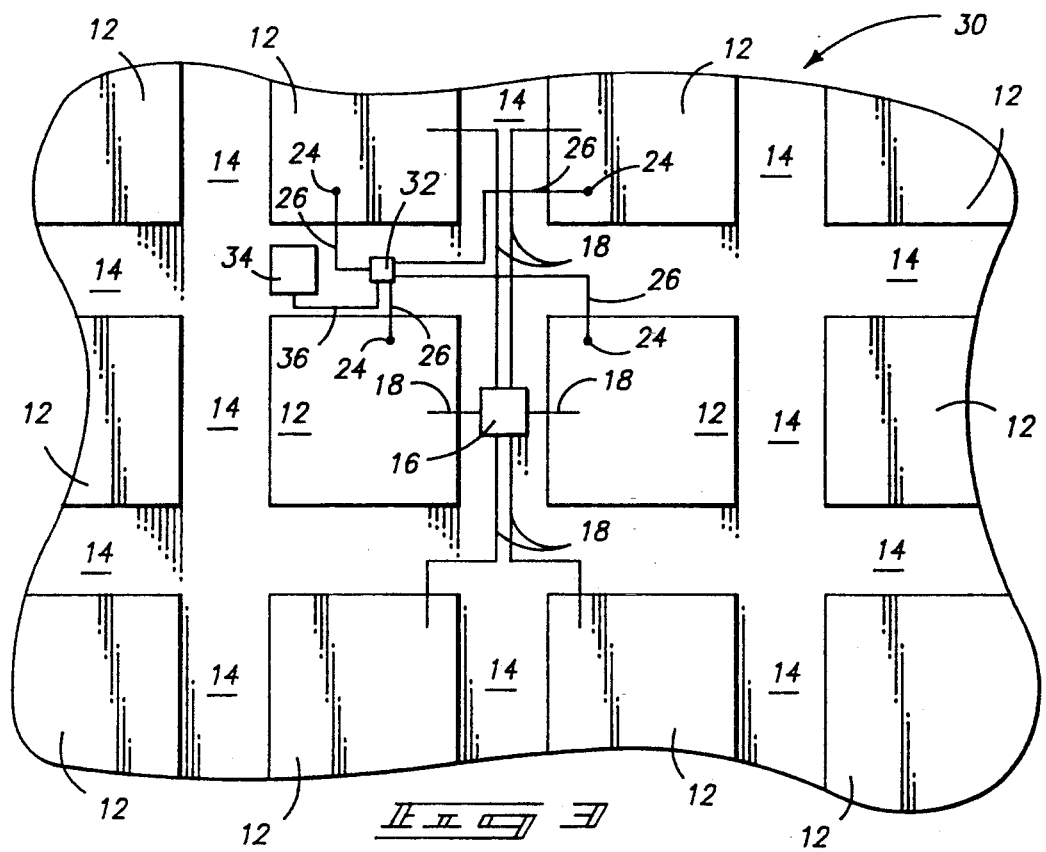
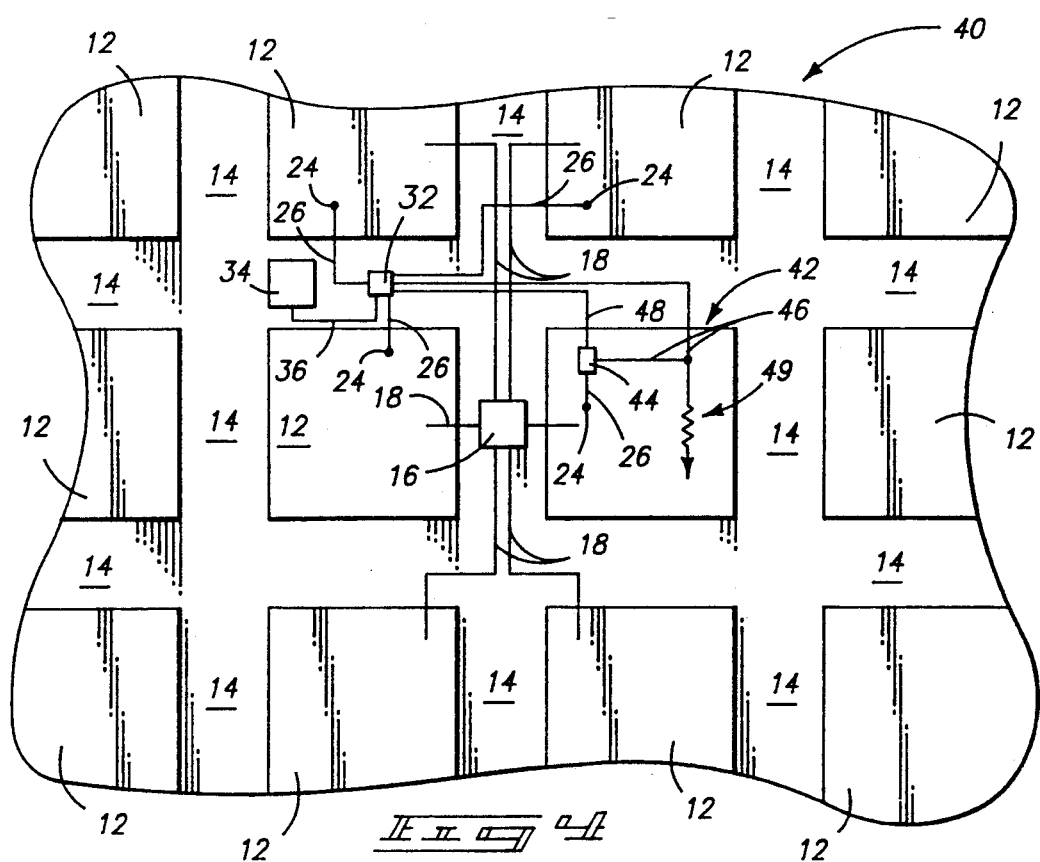

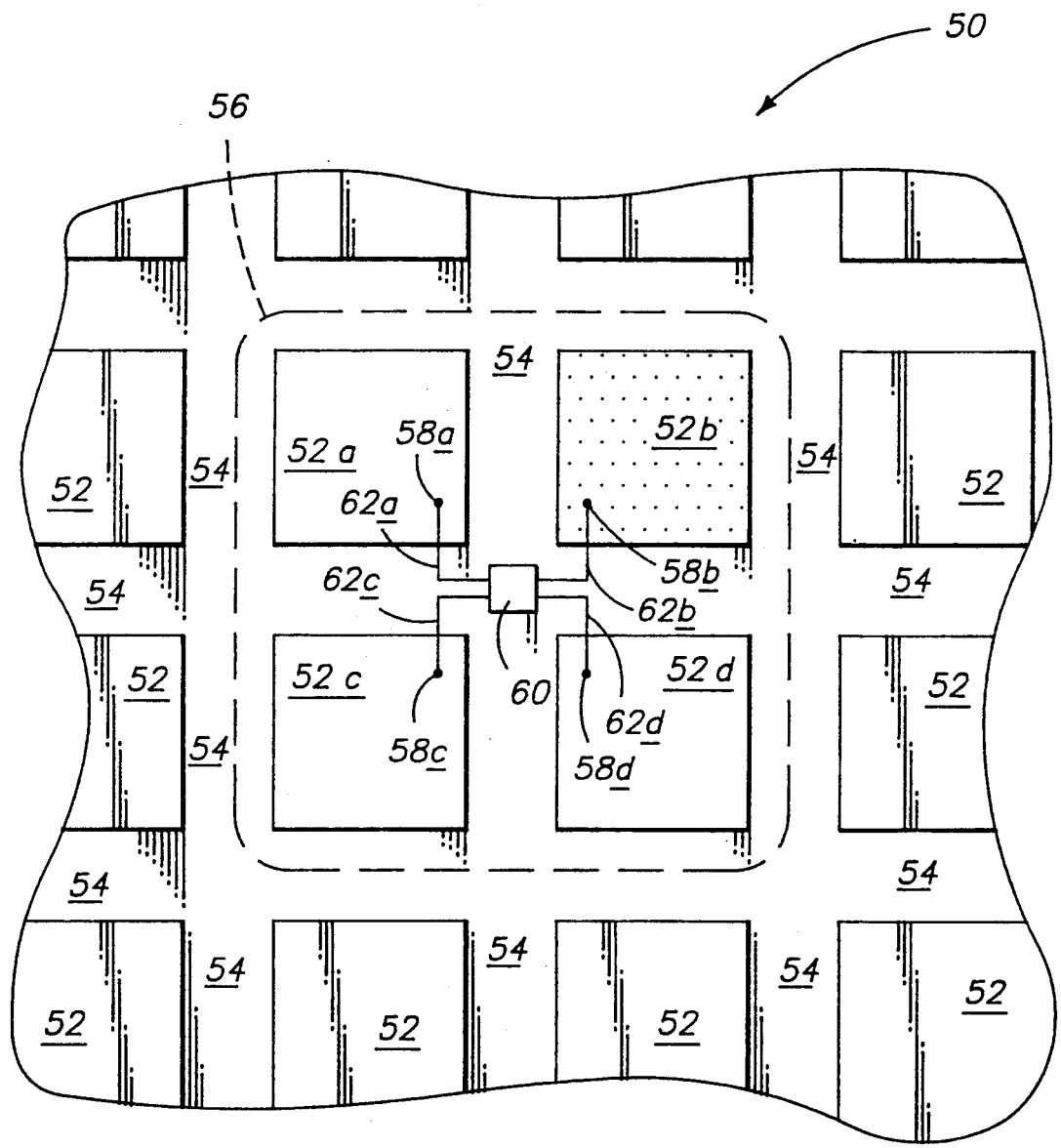
_FIG 5_

METHOD FOR FABRICATING WAFER-SCALE INTEGRATION WAFERS AND METHOD FOR UTILIZING DEFECTIVE WAFER-SCALE INTEGRATION WAFERS

RELATED PATENT DATA

This patent resulted from a continuation application of U.S. patent application Ser. No. 07/86,267, filed Sep. 21, 1990, which was abandoned.

TECHNICAL FIELD

This invention relates generally to semiconductor wafer-scale integration.

CROSS REFERENCE TO RELATED PATENTS

U.S. patent application Ser. No. 568,407, filed Aug. 16, 1990, which issued as U.S. Pat. No. 5,059,899 on Dec. 22, 1991, contains closely related subject matter to that of this invention.

BACKGROUND OF THE INVENTION

Wafer-scale integration refers to the processing of semiconductor wafers to have a multitude of discrete devices which are interconnected and whereby the wafer will not be diced. Major subsystems and even entire computers could be built on a single, undiced, standard-size wafer. The area separating the multitude of single discrete units on a wafer for a wafer-scale integration is commonly referred to as "street area".

The concept of "yield" is of great concern to semiconductor processing facilities. Overall yield is the percent of usable assembled packages as compared to the number of individual dies mapped on a wafer at the start of the process. Wafer fabrication requires a high degree of precision. One mistake can render an individual die or perhaps an entire wafer completely useless. Therefore, as the wafer proceeds through fabrication processing steps, it undergoes a variety of tests and evaluations to evaluate operability.

Yield is typically significantly below 100%, the result of wafer breakage, process variations, or process defects. In fabricating wafers to be diced, the good, usable dies are collected and assembled into packages, and the defective dies discarded. The finished product after assembly is tested to assure that working product is being shipped.

With wafer-scale integration, the concept of yield becomes even more critical and is a significant reason why successful wafer-scale integration has substantial eluded the electronics industry. Critical defects on a wafer that will not be diced effectively result in a wafer that is entirely unusable. As yields typically do not approach near 100% for a given wafer, significant redundancy would have to be built into the respective discrete components on the wafer. Circuitry must then be provided to identify and isolate nonworking components, and to provide appropriate interconnection of the working components on a single wafer.

It is desirable to maximize yield in wafer-scale integration and utilize as much of the space on the wafer as possible for circuitry.

BRIEF DESCRIPTION OF THE DRAWINGS

Preferred embodiments are described with reference to the accompanying drawings, in which:

FIG. 3 is an enlarged diagrammatic plan view of another alternate embodiment wafer in accordance with the invention.

FIG. 4 is an enlarged diagrammatic plan view of yet another alternate embodiment wafer in accordance with the invention.

FIG. 5 is an enlarged diagrammatic plan view of still another alternate embodiment wafer in accordance with the invention.

DETAILED DESCRIPTION OF THE PREFERRED EMBODIMENTS

The following disclosure of the invention is submitted in furtherance of the constitutional purpose of the Patent Laws "to promote the progress of science and useful arts" (Article 1, Section 8).

In one aspect of the invention, a semiconductor wafer that is intended to be used as a whole wafer (i.e., not intended to be diced into individual chips) comprises a plurality of discrete memory sections of integrated circuitry which are separated from one another by street area. Error detection and correction circuitry (EDC) is provided within the street area to detect and correct errors generated within the discrete memory sections. Conductive interconnecting lines extend from the discrete memory sections to the error detection and correction circuitry within the street area.

In accordance with another aspect of the invention, a semiconductor wafer that is intended to be used as a whole wafer (i.e., not intended to be diced into individual chips) comprises discrete sections of integrated circuitry separated by street area. The wafer is fabricated to define clusters of discrete sections, with each discrete section having at least one single node. A plurality of the discrete sections within the cluster comprises RAM integrated circuitry. One of the discrete sections within the cluster comprises a combination of a) control circuitry to control and coordinate operation of the discrete section within the cluster, and b) error detection and correction circuitry to detect and correct errors generated within the discrete sections of RAM integrated circuitry. Conductive interface test pads are formed within street area on the wafer to enable interface with test probes. Conductive interconnecting lines extend from selective signal nodes of selective discrete sections within the cluster. The conductive lines extend to selective conductive interface test pads within street area on the wafer either directly or, preferably, via test circuitry formed within the street area.

In yet another aspect of the invention, test pads and test circuitry are provided within the street area of a semiconductor wafer that is intended to be used as a whole wafer (i.e., not intended to be diced into individual chips). The test circuitry includes fuses which can be selectively blown. The fuses and test circuitry interconnect with selective regions within the plurality of discrete memory sections on the wafer to enable selective electrical isolation of such regions and to enable selective combination of such regions from different discrete memory sections. This enables fuses to be selectively blown upon test to interconnect operative sections of good dies, thereby effectively increasing the yield of operable circuitry on the wafer.

Figure 1:
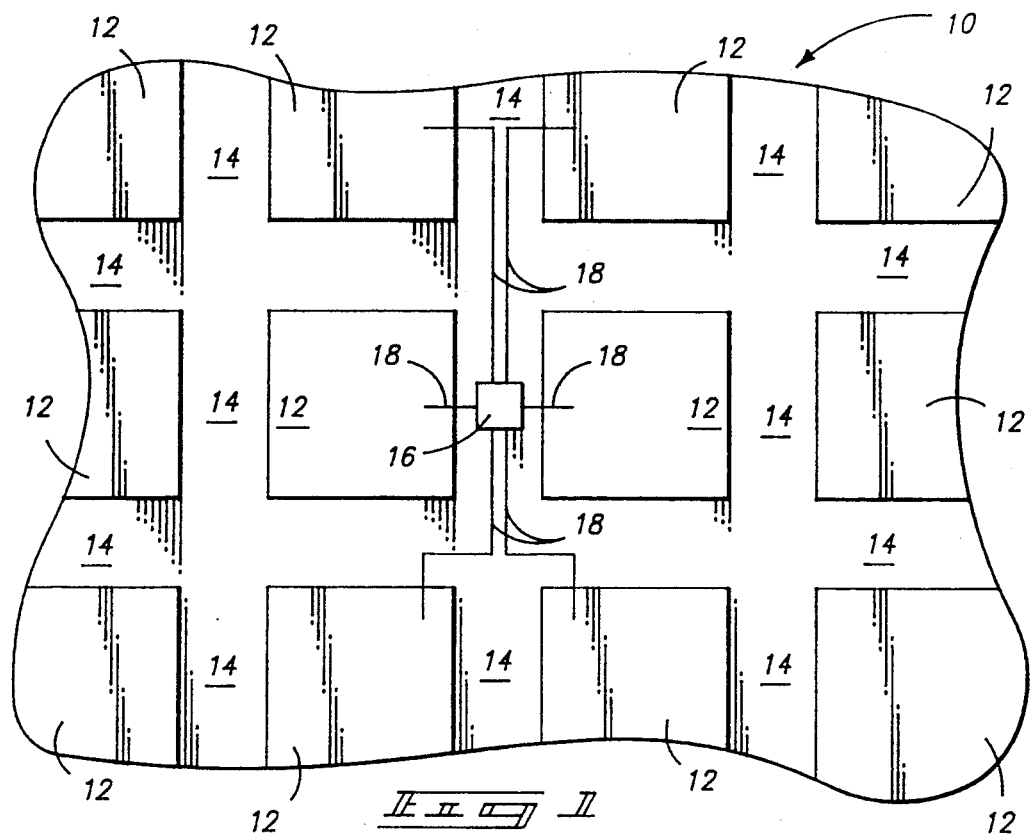
FIG. 1 is an enlarged diagrammatic plan view of a portion of a wafer in accordance with the invention.

More particularly and with reference to FIG. 1, a semiconductor wafer 10 includes a plurality of discrete memory sections 12 of integrated circuitry. Discrete memory sections 12 are separated from one another by streets or street area 14. Error detection and correction circuitry 16 is provided within street area 14. Conductive interconnecting lines 18 extend from discrete memory sections 12 to error detection and correction circuitry 16 within street area 14. Error circuitry 16 detects and corrects errors generated within discrete memory sections 12. Such error circuitry is commonly known by those skilled in the art as a digital method of error detection and correction based upon an algorithm, such as Hamming code.

Such integrated error circuitry code has in the past been placed in individual dies to detect and correct errors generated therein, but has heretofore not been placed within street area on a fully integrated wafer (wafer-scale integration) that will not be diced. In the illustrated FIG. 1 embodiment, integrated Hamming code circuitry 16 detects and corrects errors in six discrete memory sections, as shown. Of these six sections, the good cells would be retained while the defective cells would be fused out. The good cells would then be monitored by the Hamming code section to detect and correct hard and soft errors that might occur after manufacture. By way of example, eight bits of normally stored information could be tied to 4 bits of information located somewhere else. Examination of the twelve bits allows reconstruction of the stored information if a single bit has been degraded. The disclosure is by way of example made with reference to six discrete die, but this of course is not a requirement. The correction bit information could be stored and spaced far apart. This would be desirable to insure a soft error event does not affect more than one bit of a twelve bit string. A soft error bit or mechanical defect is very likely to affect adjacent cells.

Alternately, discrete error and detection circuitry could be provided in the street area adjacent each discrete section which would be dedicated to Hamming code or other error solutions within only the one discrete die. Placing the error circuitry in the street area, and designing such circuitry to interface with several sections better utilizes the area on the wafer.

Figure 2:
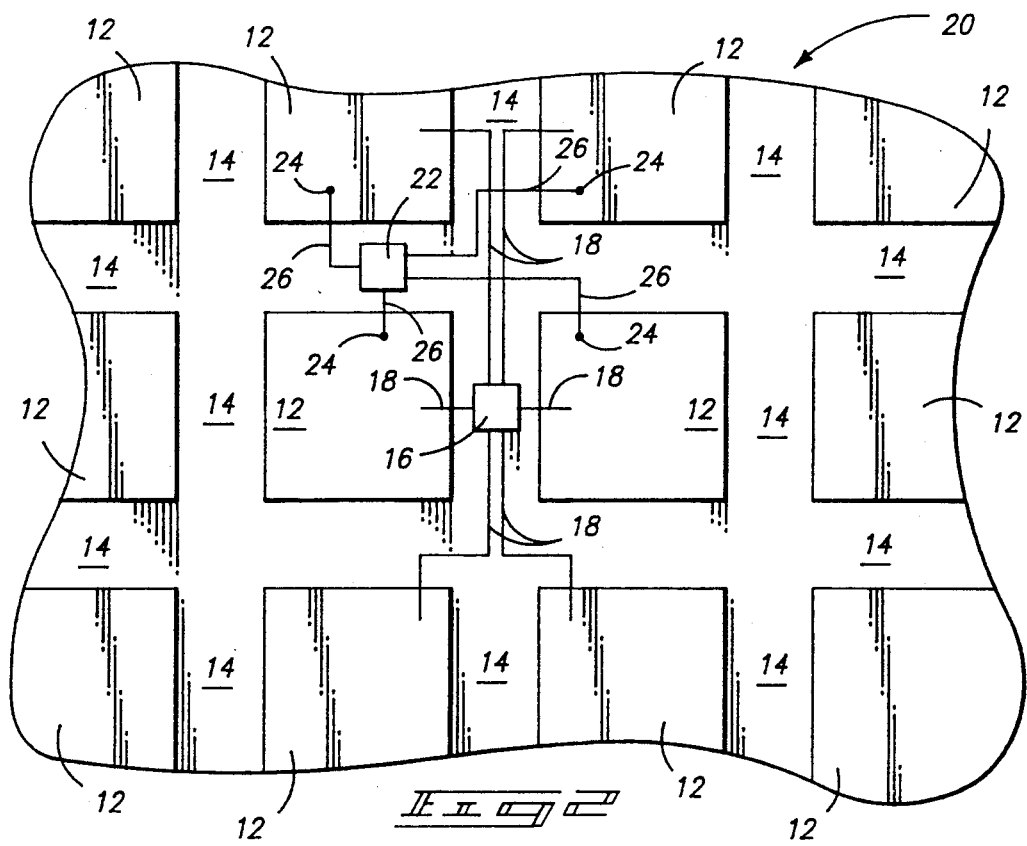
FIG. 2 is an enlarged diagrammatic plan view of an alternate embodiment wafer in accordance with the invention.

FIG. 2 illustrates an enhanced wafer 20 having added circuitry to that shown in FIG. 1. Like numerals are used which are common to the figures, where appropriate. Wafer 20 has a conductive interface test pad 22 formed within street area 14. Discrete memory sections 12 include at least one signal node 24 which is accessed to interface test pad 22 via interconnecting lines 26. Signal nodes 24 could be in the form of conventional bonding pads formed on dies that would otherwise be singulated by dicing a standard wafer.

Even with wafer-scale integration, it is expected that a large number of discrete sections 12 will contain identical memory circuitry. In such cases, it would be desirable to form memory sections 12 with conventional bonding pads and associated circuitries to enable operable dies to be produced if they were singulated from the wafer. In this manner, if after test it was determined that a significant number of sections 12 would render the full integrated wafer inoperable, defective memory sections could be identified. Then, the wafer would be severed through the street area to enable operable dies 12 to be utilized as packageable RAMs. This enables the manufacturer to use in part what would otherwise be discarded product. In short, even a semiconductor wafer that is initially intended to be used as a whole wafer (i.e., not intended to be diced into individual chips) can be used to produce saleable product.

A wafer 30 is illustrated in FIG. 3 having further additional circuitry. Illustrated is integrated test circuitry 32 which is formed within street area 14. Test circuitry 32 is in electrical communication with selected discrete memory sections 12 via interconnecting lines 26 to facilitate and coordinate simultaneous parallel testing of several of the discrete memory sections.

Test circuitry 32 could, by way of example, include decode logic to allow testing of multiple dies as follows. Incoming signals, power and ground are paralleled out to the dies. There could be single signal out lines from each die. This would allow testing dies in parallel but would also allow determining which, if any, dies are bad without requiring mechanical relocation to each die. Decode logic could allow reduction in the number of probe card contacts by allowing electronic chip selection for test, again without requiring movement of the prober. The reduction in probe movement would increase throughput.

A conductive interface test pad 34 is provided for interfacing with test probes, and electrically communicates with test circuitry 32 via connecting line 36.

Referring to FIG. 4, a wafer 40 having additional circuitry is illustrated. Such circuitry is induced voltage isolating circuitry 42 formed within one respective discrete memory section 12 as part of the conductive interconnecting line 26 extending from signal node 24. Only one respective discrete memory section 12 is illustrated as having isolating circuitry 42 for clarity. More or all of the discrete memory sections 12 could include such isolating circuitry 42 for purposes which are explained below.

Circuitry 42 comprises a transistor 44 having a gate/base control line 46 and collector/drain line 48 extending therefrom. Control line 46 is biased within the respective discrete memory section 12 by resistor/resistance 49 to bias transistor 44 in an off condition. Test circuitry 32 would be configured to selectively switch transistors 44 on via gate/base control lines 46 enable access to signal nodes 24 within the respective sections.

Such isolating circuitry is provided for those events where after test it is determined that a significant number of sections 12 would render the full integrated wafer inoperable, and accordingly wafer 40 is to be diced. Upon dicing the wafer, exposed conductive segments would exist at the edge of the dies the result of severing the conductive lines within the street area. This could result in a short or induce voltage were it not for isolating circuitry 42. The circuitry of the individual dies is configured to provide a biased resistance load 49 during their operation to maintain transistor 44 in an off condition in this event. This thereby avoids the possibility of a short or inducing voltage in the exposed lines at the edge of a singulated chip.

Although not illustrated, such isolating circuitry would also preferably be included within individual segments for the error interconnects 18 which connect with error or Hamming code circuitry 16. Most preferably, such induced voltage isolating circuitry would be provided within the discrete memory sections to connect with all conductive lines within the discrete memory sections which pass therefrom into the street area. This would thereby avoid the possibility of a short or inducing voltage in all exposed lines at the edge of a singulated chip in the event the wafer is unusable as a whole wafer.

FIG. 5 illustrates another embodiment wafer 50 in accordance with the invention. Wafer 50 is also primarily adapted to be used as a single whole wafer (i.e., not intended to be diced into individual chips). Wafer 50 includes a plurality of discrete sections of integrated circuitry 52. Such sections are separated from one another by street area 54. Discrete sections 52 include a cluster of such sections 52a, 52b, 52c and 52d as defined by an outline designated with numeral 56. Discrete sections 52 include at least one signal node 58a, 58b, 58c and 58d, respectively. The three discrete sections 52a, 52c and 52d comprise, by way of example only, SRAM or DRAM integrated circuitry. One of the discrete sections within the cluster, section 52b, comprises a) control circuitry to control and coordinate operation of discrete sections 52a, 52b, 52c and 52d within the cluster, and b) error detection and correction circuitry, such as Hamming code, to detect and correct errors generated within sections 52a, 52c and 52d.

A plurality of conductive interface test pads, such as the illustrated test pad 60, would be selectively formed within desired street area 54 on wafer 50. Conductive interconnecting lines 62a, 62b, 62c and 62d extend from signal nodes 58a, 58b, 58c and 58d, respectively, to selective conductive interface test pads 60 within street area 54. This would enable testing of sections 52a, 52c, and 52d simultaneously in parallel.

Figure 6:
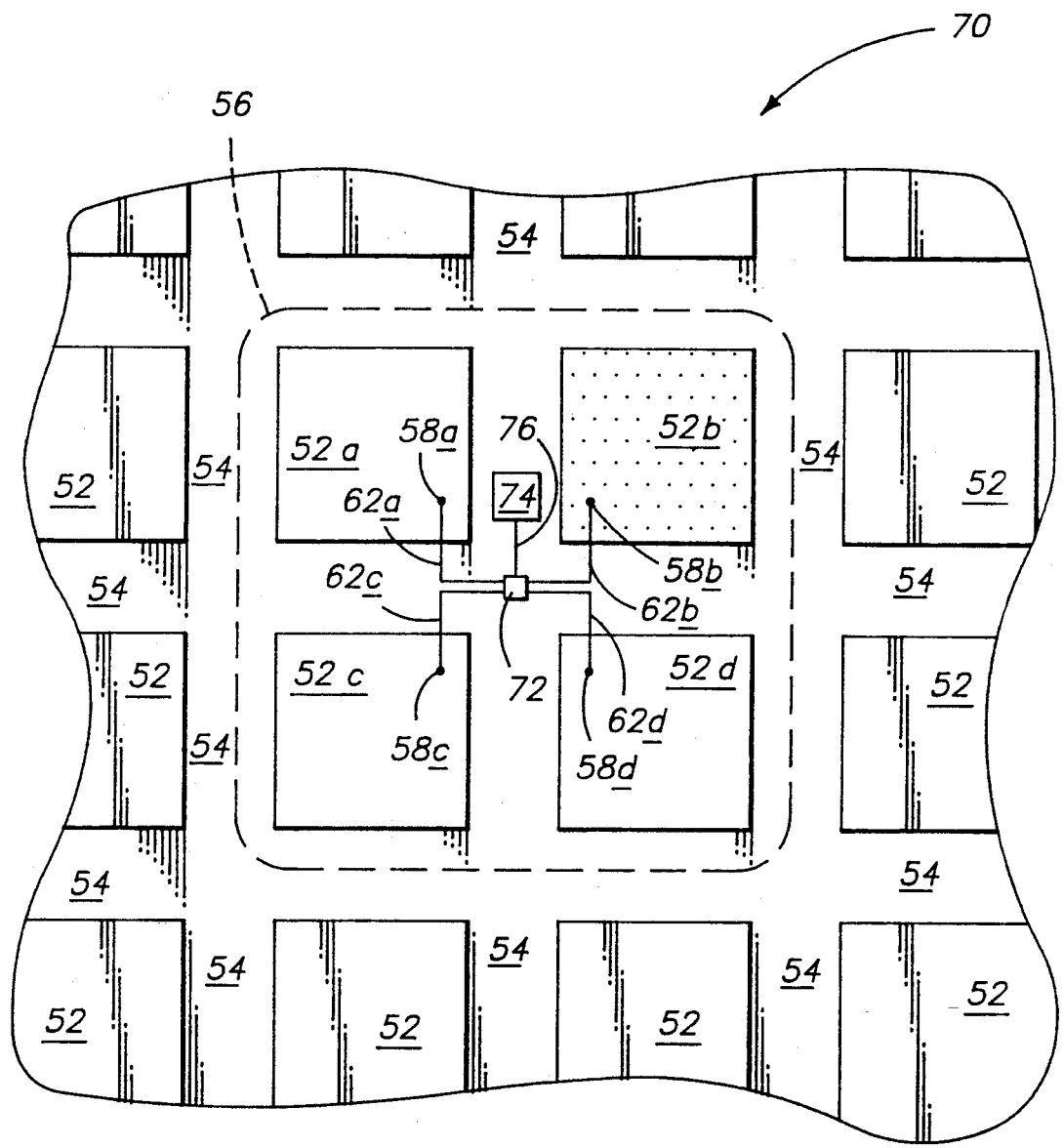
FIG. 6 is an enlarged diagrammatic plan view of yet another alternate embodiment wafer in accordance with the invention.

FIG. 6 illustrates a modified wafer 70 having additional integrated test circuitry 72 formed within street area 54 to facilitate testing of selective discrete sections 52a, 52b, 52c and 52d. A test pad 74 interconnects with test circuitry 72 via an interconnecting line 76. Test circuitry 72 could be largely analogous in design to circuitry 32 described above with reference to the FIG. 3 embodiment.

Figure 7:
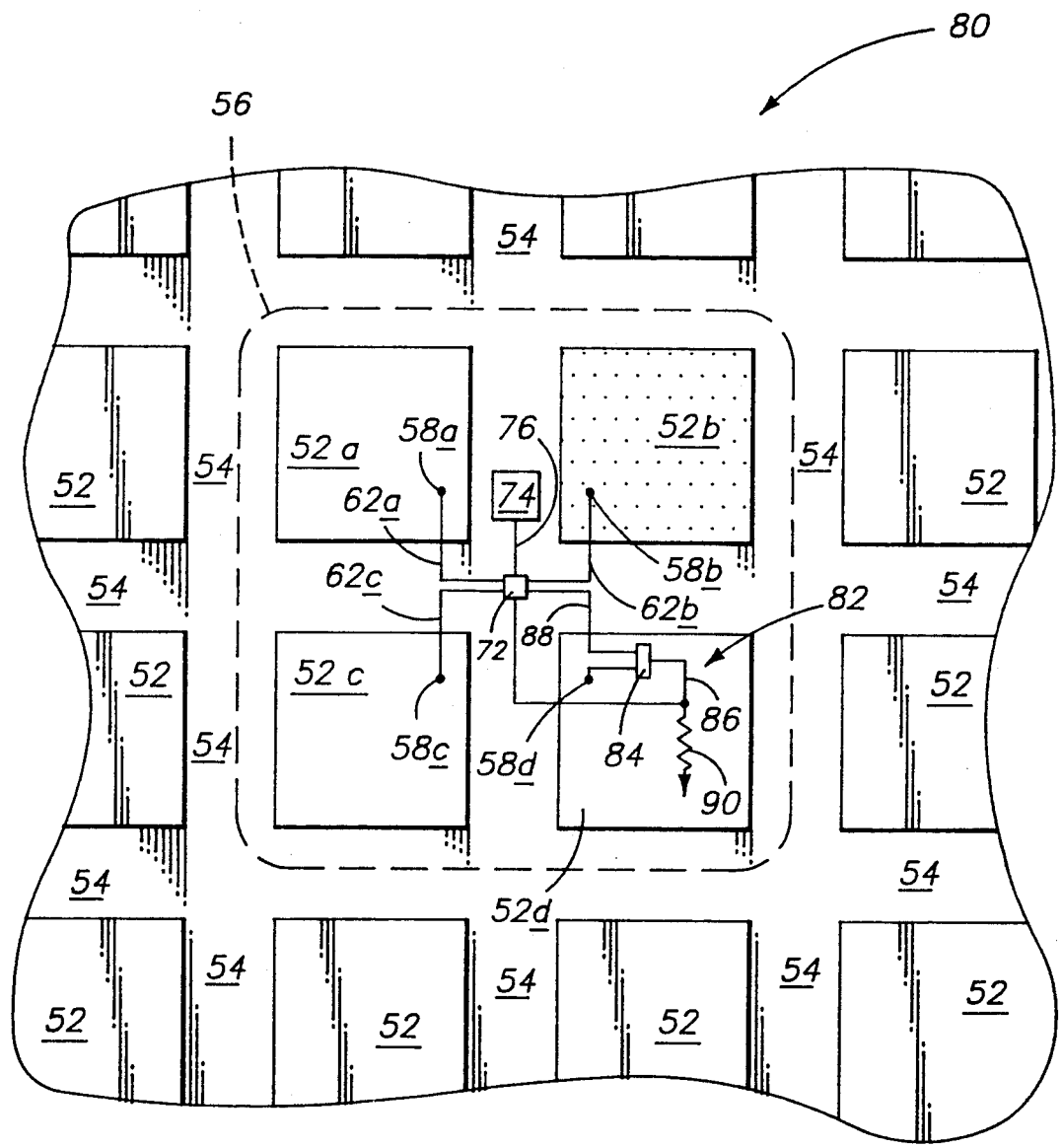
FIG. 7 is an enlarged diagrammatic plan view of another alternate embodiment wafer in accordance with the invention.

FIG. 7 illustrates a wafer 80 having induced voltage isolating circuitry 82 within discrete memory section 52d. Circuitry 82 is analogous in construction and function to circuitry 42 described above in connection with the FIG. 4 embodiment. Such circuitry includes an analogous transistor 84, control line 86, drain/emitter line 88 and resistance/resistor 90 within the discrete section. It would be provided for the same reason identified above with reference to the FIG. 4 embodiment.

In accordance with another aspect of the invention, the test circuitry within the street area could include fuses, and interconnect with several selective regions within a plurality of the discrete memory sections to enable selective electrical isolation of such regions and to enable selective combination of such regions from different discrete memory sections. In this way, the discrete memory sections could be tested to determine operative areas. Where a discrete memory section was determined to be overall dysfunctional, smaller operable regions within such dysfunctional memory section could be utilized and combined increasing yield. In other words, for example, operable areas from four dysfunctional sections could be combined via the test circuitry to create one functional section. Fuses within the test circuitry would be provided and selectively blown to isolate the inoperative areas from each respective memory section, thereby effectively increasing the yield of operable circuitry on the wafer.

Circuitry could also be formed on the wafer in the form of an additional, or Nth, basis die fabricated as an amplifier/driver. Such an amp/driver would improve the speed of the devices on the wafer that the amp/driver is associated with. Placing the amp/driver on a wafer scale integrated wafer eliminates the requirement for additional external drivers to be placed on a surrounding printed circuit board.

Yet an additional or Nth basis die could be fabricated to be used as a refresh controller/memory management device. This would enable removing of the controller function from the central processing unit or other external controller device. Refreshing (periodic recharging of the memory cell capacitors) is required because the capacitors used in dynamic memories discharge and must be refreshed in order to retain their data. In most cases, external circuitry is required for this refresh process and can sometimes complicate the design of a complete memory system.

Additionally, an Nth basis die could be fabricated to provide a combination of the two functions described in the two immediately preceding paragraphs.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A semiconductor wafer comprising:
a plurality of discrete memory sections of integrated circuitry, the discrete memory sections being separated by street area;
permanent error detection and correction circuitry within the street area to detect and correct errors generated within the discrete memory sections;
permanent conductive interconnecting lines extending from the discrete memory sections to the error detection and correction circuitry within the street area; and
the semiconductor wafer being maintained as a whole and the error detection and correction circuitry and the interconnecting lines being permanently retained and operable on the wafer.

2. The semiconductor wafer of claim 1 wherein the error correction and detection circuitry is configured to detect and correct errors in a plurality of the discrete memory sections.

3. The semiconductor wafer of claim 1 wherein the conductive interconnecting line extending to the error detection and correction circuitry includes induced voltage isolating circuitry formed within the respective discrete memory section.

4. The semiconductor wafer of claim 1 further comprising induced voltage isolating circuitry formed within the discrete memory sections, the induced voltage isolating circuitry connecting with all conductive lines within the discrete memory sections which pass from the discrete sections into the street area.

5. The semiconductor wafer of claim 1 wherein, the error correction and detection circuitry is configured to detect and correct errors in a plurality of the discrete memory sections; and the discrete memory sections include at least one signal node, the semiconductor wafer further comprising a conductive interface test pad formed in the street area, a conductive interconnecting line extending from the at least one signal node to the conductive interface test pad in the street area.

6. The semiconductor wafer of claim 5 wherein the conductive interconnecting line extending from the at least one signal node within a respective discrete memory section includes induced voltage isolating circuitry formed within the respective discrete memory section.

7. The semiconductor wafer of claim 5 wherein the conductive interconnecting lines extending from the at least one signal node within a respective discrete memory section and those extending to the error detection and correction circuitry include induced voltage isolating circuitry formed within the respective discrete memory section.

8. The semiconductor wafer of claim 1 wherein the discrete memory sections include at least one signal node, the semiconductor wafer further comprising a conductive interface test pad formed in the street area, a conductive interconnecting line extending from the at least one signal node to the conductive interface test pad in the street area.

9. The semiconductor wafer of claim 8 wherein the conductive interconnecting line extending from the at least one signal node within a respective discrete memory section includes induced voltage isolating circuitry formed within the respective discrete memory section.

10. The semiconductor wafer of claim 9 wherein the induced voltage isolating circuitry comprises a transistor within the respective discrete memory section, the transistor having a control line which is biased within the respective discrete memory section to place the transistor in an off condition.

11. The semiconductor wafer of claim 1 further comprising integrated test circuitry formed within the street area, the test circuitry being in electrical communication with selected discrete memory sections to facilitate testing of the selected discrete memory sections.

12. The semiconductor wafer of claim 11 wherein the integrated test circuitry comprises circuitry enabling testing of several selected discrete memory sections simultaneously in parallel.

13. The semiconductor wafer of claim 1 wherein the error correction and detection circuitry is configured to detect and correct errors in a plurality of the discrete memory sections; and further comprising integrated test circuitry formed within the street area, the test circuitry being in electrical communication with selected discrete memory sections to facilitate testing of the selected discrete memory sections.

14. The semiconductor wafer of claim 13 wherein the integrated test circuitry comprises circuitry enabling testing of several selected discrete memory sections simultaneously in parallel.

15. The semiconductor wafer of claim 1 wherein the discrete memory section include at least one signal node, the semiconductor wafer further comprising:

integrated test circuitry formed within the street area to facilitate testing of selected discrete memory sections;

a conductive interconnecting line extending from the at least one signal node to the integrated test circuitry; and the integrated test circuitry including a conductive interface test pad formed in the street area.

16. The semiconductor wafer of claim 15 wherein the conductive interconnecting line extending from the at least one signal node within a respective discrete memory section includes induced voltage isolating circuitry formed within the respective discrete memory section.

17. The semiconductor wafer of claim 16 wherein the induced voltage isolating circuitry comprises a transistor within the respective discrete memory section, the transistor having a control line which is biased within the respective discrete memory section to place the transistor in an off condition.

18. The semiconductor wafer of claim 1 further comprising refresh controller/memory management circuitry formed on the wafer.

19. The semiconductor wafer of claim 1 further comprising amplifier/driver circuitry formed on the wafer to improve speed of devices on the wafer that the amplifier driver circuitry is associated with.

20. A semiconductor wafer comprising:

a cluster of discrete sections of integrated circuitry, the discrete sections being separated within the cluster by street area, the discrete sections each being at least one signal node;

a plurality of the discrete sections within the cluster comprising RAM integrated circuitry;

one of the discrete sections within the cluster comprising a) control circuitry to control and coordinate operation of discrete sections within the cluster, and b) error detection and correction circuitry to detect and correct errors generated within the discrete sections of RAM integrated circuitry;

a plurality of conductive interface test pads formed within street area on the wafer;

permanent conductive interconnecting lines extending from selective signal nodes of selective discrete sections within the cluster, the conductive interconnecting lines extending to selective conductive interface test pads within street area on the wafer; and the semiconductor wafer being maintained as a whole and the interconnecting lines being permanently retained and operable on the wafer.

21. The semiconductor wafer of claim 20 further comprising integrated test circuitry formed within street area on the wafer to facilitate testing of the selective discrete sections, the test circuitry connecting with the conductive interconnecting lines.

22. The semiconductor wafer of claim 21 wherein the integrated test circuitry comprises circuitry enabling testing of several selected discrete memory sections simultaneously in parallel.

23. The semiconductor wafer of claim 20 wherein the conductive interconnecting lines extending from the selective signal nodes include induced voltage isolating circuitry formed within respective discrete sections.

24. The semiconductor wafer of claim 23 wherein the induced voltage isolating circuitry comprises a transistor within the respective discrete section, the transistor having a control line which is biased within the respective discrete section to place the transistor in an off condition.

25. The semiconductor wafer of claim 20 wherein the conductive interconnecting lines extending from the selective signal nodes of the selective discrete sections within the cluster include induced voltage isolating circuitry formed within respective discrete sections; and the semiconductor wafer further comprising integrated test circuitry formed within street area on the wafer to facilitate testing of the selective discrete sections, the test circuitry connecting with the conductive interconnecting lines.

26. The semiconductor wafer of claim 25 wherein the induced voltage isolating circuitry comprises a transistor within the respective discrete section, the transistor having a control line which is biased within the respective discrete section to place the transistor in an off condition.

27. The semiconductor wafer of claim 25 wherein the integrated test circuitry comprises circuitry enabling testing of several selected discrete memory sections simultaneously in parallel.

28. The semiconductor wafer of claim 20 further comprising induced voltage isolating circuitry formed within the discrete sections containing RAM integrated circuitry, the induced voltage isolating circuitry connecting with all conductive lines within the discrete sections which pass from the discrete sections into the street area.

29. The semiconductor wafer of claim 28 wherein the induced voltage isolating circuitry comprises a transistor, the transistor having a control line which is biased within the respective discrete section to place the transistor in an off condition.

30. The semiconductor wafer of claim 20 further comprising refresh controller/memory management circuitry formed on the wafer.

31. The semiconductor wafer of claim 20 further comprising amplifier/driver circuitry formed on the wafer to improve speed of devices on the wafer that the amplifier driver circuitry is associated with.

32. A semiconductor wafer comprising:
a plurality of discrete memory sections of integrated circuitry, the discrete memory sections being separated by street area, the discrete memory sections including at least one signal node;
permanent test circuitry within the street area, the test circuitry comprising fuses within the street area, the test circuitry and fuses interconnecting with selective regions within the plurality of the discrete memory sections to enable selective electrical isolation of such regions and to enable selective combination of such regions from different discrete memory sections, the test circuitry including a plurality of conductive interface test pads formed within the street area;
permanent conductive interconnecting lines extending from signal nodes of discrete memory sections to the test circuitry; and
the semiconductor wafer being maintained as a whole and the test circuitry and conductive interconnecting lines being permanently retained and operable on the wafer.

33. The semiconductor wafer of claim 32 wherein the test circuitry comprises circuitry enabling testing of several selected discrete memory sections simultaneously in parallel.

34. The semiconductor wafer of claim 32 wherein the conductive interconnecting lines extending from the signal nodes include induced voltage isolating circuitry formed within respective discrete memory sections.

35. The semiconductor wafer of claim 34 wherein the induced voltage isolating circuitry comprises a transistor within the respective discrete memory section, the transistor having a control line which is biased within the respective discrete memory section to place the transistor in an off condition, the control line connecting with the test circuitry within the street area.

36. The semiconductor wafer of claim 32 wherein:
the test circuitry comprises circuitry enabling testing of several selected discrete memory sections simultaneously in parallel; and
the conductive interconnecting lines extending from the signal nodes include induced voltage isolating circuitry formed within respective discrete memory sections.

37. The semiconductor wafer of claim 36 wherein the induced voltage isolating circuitry comprises a transistor within the respective discrete memory section, the transistor having a control line which is biased within the respective discrete memory section to place the transistor in an off condition, the control line connecting with the test circuitry within the street area.

38. The semiconductor wafer of claim 32 further comprising induced voltage isolating circuitry formed within the discrete memory sections, the induced voltage isolating circuitry connecting with all conductive lines within the discrete memory sections which pass from the discrete sections into the street area.

39. The semiconductor wafer of claim 32 further comprising refresh controller/memory management circuitry formed on the wafer.

40. The semiconductor wafer of claim 32 further comprising amplifier/driver circuitry formed on the wafer to improve speed of devices on the wafer that the amplifier driver circuitry is associated with.

* * * * *